United States Patent [19]

Joshi

[11] Patent Number: 4,732,801
[45] Date of Patent: Mar. 22, 1988

[54] GRADED OXIDE/NITRIDE VIA STRUCTURE AND METHOD OF FABRICATION THEREFOR

[75] Inventor: Rajiv V. Joshi, Yorktown Heights, N.Y.

[73] Assignee: International Business Machines Corporation, Armonk, N.Y.

[21] Appl. No.: 858,319

[22] Filed: Apr. 30, 1986

[51] Int. Cl.⁴ .................. B32B 27/14; B32B 9/00; C25D 11/02; B05D 1/36

[52] U.S. Cl. ........................... 428/198; 427/123; 427/255.1; 427/419.7; 428/209; 428/210; 428/428; 428/446; 428/450; 428/469; 428/627; 428/628; 428/629; 428/665; 428/698; 428/901; 437/241; 437/243

[58] Field of Search ............ 428/665, 901, 450, 137, 428/627, 628, 622, 198, 209, 210, 428, 446, 704, 698, 469; 427/419.7, 123, 91, 124, 255.1, 88; 156/DIG. 69, 64; 148/DIG. 19, 177, 174, 180

[56] References Cited

U.S. PATENT DOCUMENTS

| | | | |
|---|---|---|---|
| 3,477,872 | 11/1969 | Amick | 117/212 |
| 3,649,884 | 3/1972 | Haneta | 317/235 |
| 3,656,995 | 4/1972 | Reedy, Jr. | 117/69 |
| 3,664,874 | 5/1972 | Epstein | 428/665 |
| 3,704,166 | 11/1972 | Cuomo et al. | 117/217 |
| 3,785,862 | 1/1974 | Grill | 117/217 |
| 4,180,596 | 12/1979 | Crowder et al. | 427/42 |
| 4,337,476 | 6/1982 | Fraser et al. | 428/472 |
| 4,404,235 | 9/1983 | Tarng et al. | 427/91 |
| 4,547,432 | 10/1985 | Pitts et al. | 428/450 |
| 4,557,943 | 12/1985 | Rosler et al. | 427/419.7 |
| 4,619,035 | 10/1986 | Hotta et al. | 148/DIG. 19 |
| 4,629,635 | 12/1986 | Brors | 427/255 |
| 4,650,698 | 3/1987 | Moriya et al. | 427/419.7 |

OTHER PUBLICATIONS

Hess, Dennis, "Plasma Enhanced CVD: Oxides, Nitrides, Transition Metals and Transition Metal Silicides", J. Vac. Sci. Technol., pp. 244–252, Jun. 84.
Cooke, M. J., "A Review of LPCVD Metallization for Semiconductor Devices", vacuum, pp. 67–73, Feb. 85.
Broadbent, E. K., "Selective Tungsten Processing by Low Pressure CVD", Solid State Technol., pp. 51–59, Dec. 85.
"VLSI Fabrication Principles" by Sarab K. Ghandi.

Primary Examiner—Ellis P. Robinson
Assistant Examiner—James B. Monroe
Attorney, Agent, or Firm—Jackson E. Stanland

[57] ABSTRACT

A structure and method for fabricating the structure, which includes a layer containing a refractory metal and a substrate to which the refractory metal-containing layer does not strongly adhere, there being a thin bonding layer between the substrate and the refractory metal-containing layer for providing good adherence between the refractory metal-containing layer and the substrate. The bonding layer is an oxide, nitride or mixed oxy-nitride layer initially prepared to be Si-rich in a surface region thereof. Inclusions of the refractory metal are produced in the bonding layer by substituting the refractory metal for excess free silicon therein. These inclusions become nucleation and bonding sites for refractory metal deposition, ensuring good adhesion.

27 Claims, 3 Drawing Figures

GRADED OXIDE/NITRIDE VIA STRUCTURE AND METHOD OF FABRICATION THEREFOR

DESCRIPTION

1. Field of the Invention

This invention relates to a structure and method for forming such a structure, wherein a refractory metal or refractory metal silicide will strongly adhere to a substrate to which it will not normally adhere well, and more particularly to the use of a specially fabricated bonding or adhesion layer between the refractory metal and the substrate, in order to ensure strong adhesion therebetween.

2. Background Art

In the microelectronics industry, it is often disirable to deposit metal layers, such as refractory metals, onto substrates such as glasses, etc. The metal layers are used for several purposes including interconnection metallurgy and contacts. However, it has often been difficult, or impossible, to deposit metal layers which will strongly adhere to the substates. In particular, it has been difficult to adhere refractory metal layers such as tungsten to dielectric layers, such as glasses. Since tungsten is a preferred metal in the fabrication of VLSI devices, due to its good electromigration properties, a solution to this problem is very important in this technology.

U.S. Pat. No. 3,785,862, issued Jan. 15, 1974, shows a method for depositing a refractory metal on an oxide coating by simultaneously etching the oxide with a metallic hexafluoride and depositing a relatively thin layer of the refractory metal by the reduction of the hexafluoride. Thereafter, a relatively thick layer of a refractory metal is deposited by the reduction of the hexafluoride.

U.S. Pat. No. 3,477,872 shows a method for depositing a refractory metal on a semiconductor substrate oxide coating which includes the steps of etching the oxide coating with a metallic hexafluoride and then depositing the refractory metal on the oxide coating by the hydrogen reduction of the hexafluoride. In the process, silicon which is exposed through the oxide coating reacts with the tungsten hexafluoride and, by a replacement reaction, a thin layer of tungsten is formed on the silicon.

U.S. Pat. No. 3,649,884 issued Mar. 14, 1972 shows a process for the formation of pyrolytic oxide layers which contain excess silicon.

U.S. Pat. No. 4,404,235 issued Sept. 13, 1983, shows the surface of a dielectric such as silicon dioxide being exposed to gaseous tungsten hexafluoride and hydrogen at a temperature of approximately 600° C. This initiates the formation of tungsten islands on the dielectric surface without damaging the surface. An appropriate metallization layer is then deposited from the vapor phase onto the tungsten island-covered dielectric surface. A layer of platinum is then sputtered over the discontinuous tungsten islands.

U.S. Pat. No. 3,704,166, issued Nov. 28, 1972, shows a method for improving adhesion between a conductive layer and a substrate of insulating material which includes the steps of providing a substrate of insulating material such as silicon dioxide which contains a first cation and a first axion. A second cation such as aluminum is introduced into the substrate substitutionally by diffusion or ion bombardment. Finally, a layer of conductive material is deposited on the surface of the substrate by vacuum evaporation or sputtering. The conductive material includes a third cation such as tungsten which has an affinity for the first anion. The introduction of the second cation is carried out in only the surface layers of the substrate such that the dielectric characteristics of the substrate are substantially unaffected. This invention basically teaches providing sites, in an insulating substrate, containing unbound atoms which are capable of chemically bonding with the deposited conductive material thereby obtaining improved adhesion at low temperatures.

None of the above-cited prior art references utilizes an insulator which includes silicon particles or nucleation sites within the insulator for bonding a refractory metal and, particularly, tungsten. While substitution reactions which substitute tungsten for silicon are well-known, none of the references cited use the substitution reaction to convert silicon particles to tungsten particles within the insulator and then deposit tungsten to form with the now-formed tungsten particles a highly adherent layer of tungsten on the surface of an oxide or nitride layer.

It is, therefore, an object of the present invention to provide an improved method for forming highly adherent tungsten layers on the surface of oxide or nitride insulators.

It is another object of this invention to provide an improved process and structure for bonding refractory metals and refractory metal silicides to substrates where the layers are not subject to delamination during further processing steps such as annealing at elevated temperatures.

Another object is to provide a process whereby refractory metals like tungsten, deposited on insulators, are not subject to delamination.

Another object of this invention is to provide an improved structure and method for fabricating that structure, wherein a refractory metal layer (or refractory metal silicide layer) is strongly bonded to a substrate, to which it would not directly bond with good adherence, by the use of an intermediate bonding layer having inclusions of the refractory metal therein.

A further object is to provide a process for depositing refractory metal layers wherein silicon-rich silicon dioxide or silicon nitride layers are used in conjunction with a tungsten hexafluoride reaction to convert at least a portion of the excess silicon inclusions to tungsten, thereby forming a like species to which subsequently deposited tungsten can adhere.

Still another object is to provide an improved structure for use in conjunction with semiconductors which includes a layer of tungsten deposited on a layer of silicon-rich oxide or nitride wherein at least a portion of the silicon has been converted to tungsten to form a highly adherent base for the tungsten layer.

SUMMARY OF THE INVENTION

The present invention relates to a process for forming highly adherent layers of a refractory metal like tungsten (or a silicide) on the surface of insulators like silicon dioxide or silicon nitride, where the metal and insulator layers are not subject to delamination. The process basically includes the step of forming a silicon-rich silicon oxide or nitride layer (or mixed oxy-nitride layer) on a substrate. The substrate may be any material on which one would normally want to deposit a refractory metal such as tungsten. A material such as borophosphosilicate glass (BPSG) is one such material. In the usual case, if tungsten is deposited as a refractory metal silicide ($WSi_x$) or as tungsten alone, the resulting layer is subject to delamination.

After the silicon-rich silicon dioxide or silicon nitride layer is formed on the substrate, the substrate is placed in a Low Pressure Chemical Vapor Deposition (LPCVD) reactor and tungsten hexafluoride ($WF_6$) is introduced into the reactor, which has been evacuated to below 10 millitorr. The substrate is held at a temperature between 300°–400° C. while tungsten hexafluoride flows over it at a volume flow rate in the range of 10–20 sccm for a time in the range of 200–300 seconds. Nucleation sites for tungsten are created in the silicon oxide or silicon nitride by the following reactions:

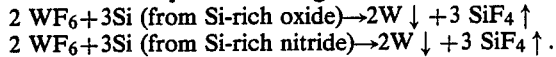

Using the above reactions, tungsten is substituted for free silicon particles at or near the surface of the silicon-rich oxide or nitride layer. The resulting layer still retains its basically insulating character of a pure silicon oxide or silicon nitride layer because there is insufficient free silicon and tungsten therein to permit current to flow through such a layer.

In a final step, tungsten hexafluoride and hydrogen are introduced at a volume flow rate in the range of 500–2000 sccm at a temperature in the range of 300°–400° C. for a time sufficient to form a layer of desired thickness.

The ability to bond tungsten to tungsten sites, which are themselves bonded into a silicon oxide or silicon nitride matrix, now makes it possible to provide a bonding medium between tungsten and a substrate such as BPSG. This bonding medium is a silicon dioxide or silicon nitride layer which is silicon-rich and wherein at least a portion of the free silicon particles have been substituted for by tungsten, creating a bonding medium which contains free silicon and free tungsten inclusions. In this way, tungsten, is bonded to the tungsten inclusions and the silicon dioxide or silicon nitride is bonded to the BPSG.

These and other objects, features and advantages will be more apparent from the following more particular description of the invention as illustrated in the accompanying drawings.

DESCRIPTION OF THE PREFERRED EMBODIMENTS

In the fabrication of integrated circuits, materials are often used because they possess a certain desirable quality. One example of this is the refractory metal tungsten, which is often selected because of its good electromigration properties. The same material, however, when used with other materials such as boro-phosphosilicate glass (BPSG) and deposited directly on it, is subject to undesirable events such as delamination during integrated circuit fabrication. One approach has been to provide an intermediate layer of a material such as tungsten silicide ($WSi_x$) between the BPSG and the overlying tungsten layer. This has not proved to be a satisfactory solution in that silicon from the $WSi_x$ can migrate to the overlying layer of tungsten to convert portions of it to a silicide at elevated processing temperatures. Secondly, $WSi_x$ has a very high stress. Also, the delamination properties of such a structure are not significantly improved and the etching of such a structure might be a problem.

Figure 1:
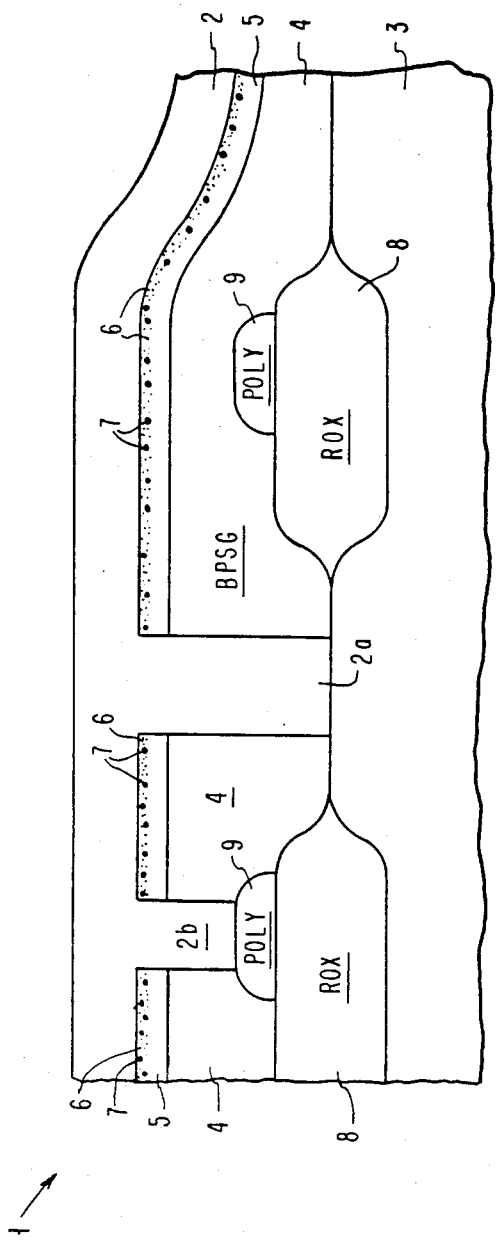
FIG. 1 is a cross-sectional schematic illustration of an integrated circuit chip showing a via structure wherein a tungsten interconnection line is connected to a semiconductor substrate and is simultaneously intemately bonded to a BPSG insulator structure by means of an intermediate bonding layer of silicon dioxide or silicon nitride which contains inclusions of silicon and a refractory metal such as tungsten.
Figure 2:
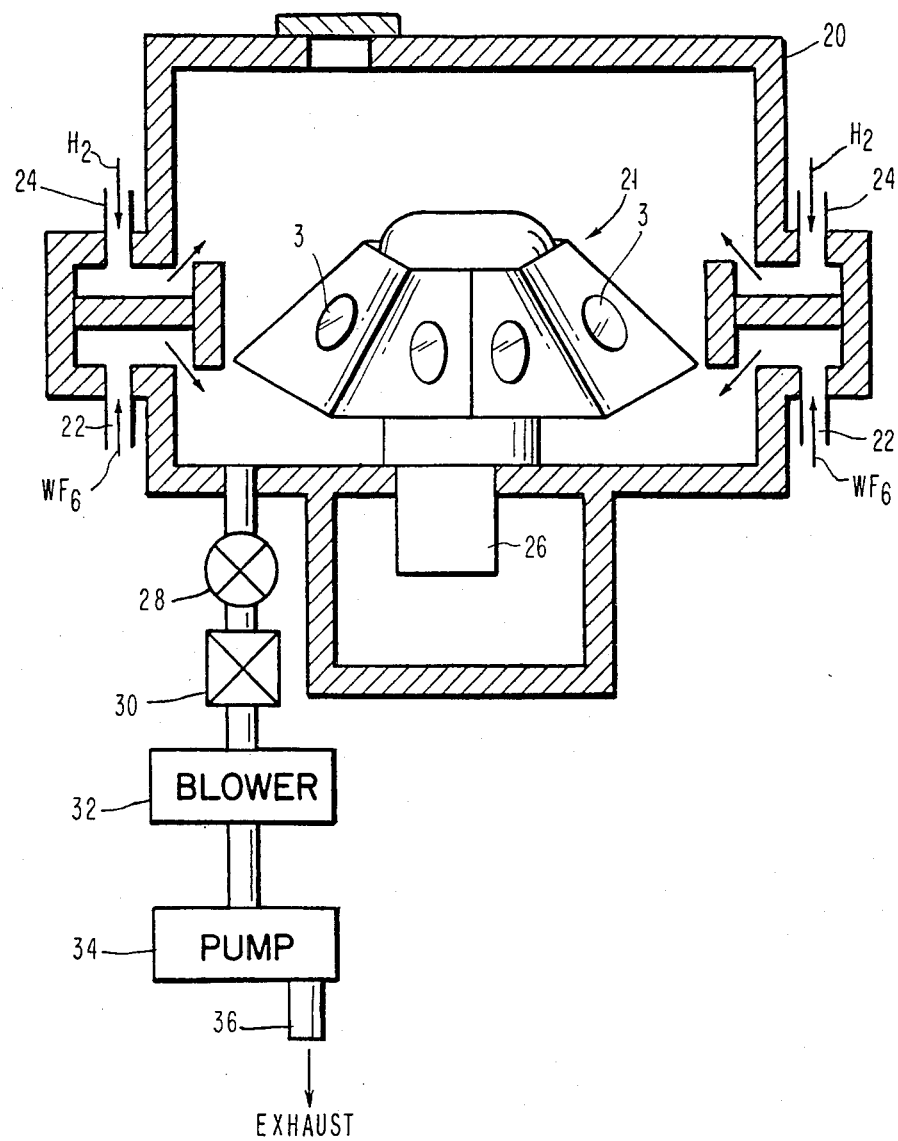
FIG. 2 is a schematic drawing which illustrates a typical deposition apparatus used in carrying out the method of the present invention.
Figure 3:
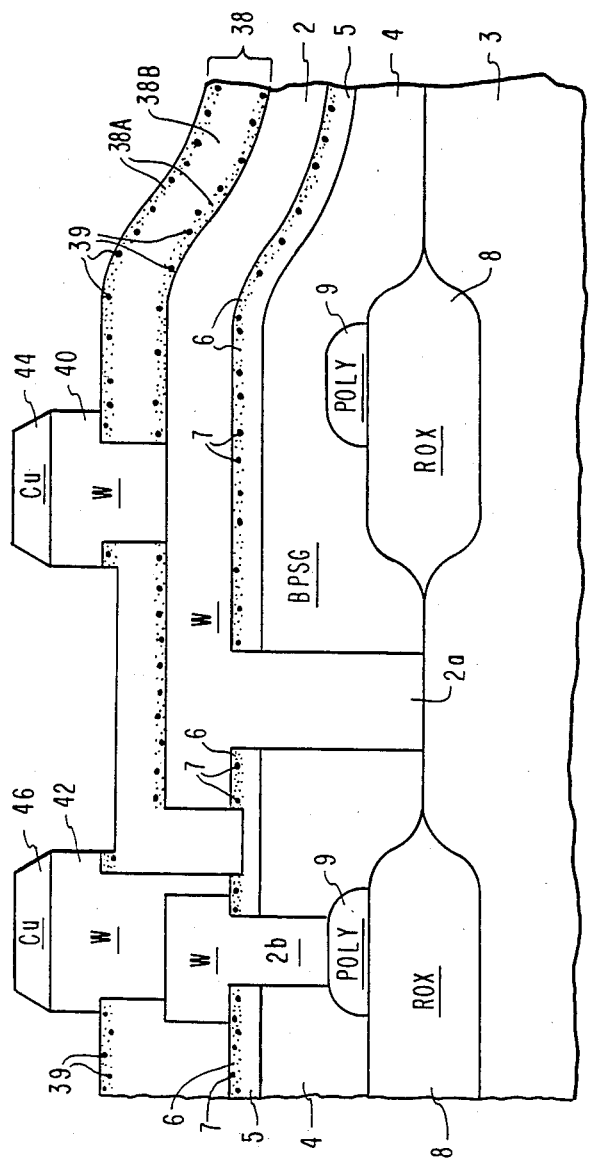
FIG. 3 is a cross-sectional schematic illustration of a graded oxide/nitride via structure fabricated in accordance with the process of the present invention.

FIG. 1 is a cross-sectional schematic illustration of an integrated circuit chip 1 showing a via structure wherein a refractory metal interconnection line 2 is connected to a semiconductor substrate 3 and is simultaneously disposed in intimately bonded relationship with a BPSG layer 4 by means of an intermediate bonding layer 5 of silicon dioxide or silicon nitride which contains particles 6 of free silicon and inclusions 7 of the refractory metal. In the discussion of FIGS. 1–3, the refractory metal will be illustrated by tungsten, which is a particularly important material and one which most significantly exhibits the benefits of the present invention.

In FIG. 1, tungsten interconnection layer 2 contacts substrate 3 by means of a tungsten via 2a through a via hole formed in BPSG layer 4. Recessed oxide regions 8, formed in substrate 3, have on their surfaces polycrystalline regions 9. Tungsten interconnection layer 2 may be connected to a polycrystalline region 9 by means of a tungsten via 2b through a via hole formed in BPSG layer 4. Tungsten interconnection layer 2 is strongly bonded to BPSG layer 4 by means of bonding layer 5.

In the fabrication process which will be described in detail hereinbelow in connection with FIG. 2, particles 6 of free silicon at or near the surface of layer 5 are substituted for by a substitution reaction with tungsten hexafluoride, forming tungsten inclusions 7 where the reaction is carried out. Then, when tungsten interconnection layer 2 is deposited by the hydrogen reduction of tungsten hexafluoride, the depositing tungsten encounters nucleation centers to which it becomes intimately bonded forming a layer of tungsten which is not subject to delamination. Particles 6 of free silicon may be distributed uniformly throughout bonding layer 5 or they may be distributed in graded fashion in layer 5 so that there are no particles of silicon near the bottom of layer 5 and the maximum number of particles 6 are present at the top of layer 5.

To obtain the structure of FIG. 1, the apparatus of FIG. 2 is used to carry out the deposition of tungsten from a hexafluoride gas. However, prior to such deposition, a semiconductor substrate 3 having recessed oxide regions 8 formed in the surface thereof is fabricated using well-known masking, photolithographic, etching and thermal growth to ultimately provide recessed oxide regions 8. Once the recessed oxide regions 8 are formed, polycrystalline regions 9 are formed by the deposition of a blanket layer of polycrystalline silicon using the decomposition of silane, for example, in a well-known way. Then using masking, lithographic and etching steps, regions 9 are provided. After regions 9 are in place, a layer 4 of BPSG is deposited using well-known deposition techniques. A reference which describes techniques for making glass layers is a text by S. K. Ghandhi, entitled VLSI FABRICATION PRINCIPLES, published by John Wiley and Sons, copyright 1983. Specific reference is made to pages 424–427 and 440,441 thereof where the preparation of phosphosilicate type glasses is described.

At this point, layer 5 of silicon-rich silicon dioxide or silicon nitride is formed. The technique for forming such layers is well-known and is described in detail in U.S. Pat. No. 3,649,884 which is hereby incorporated by reference. Briefly, layer 5 may be deposited from the vapor phase using an $N_2O$: $SiH_4$ ratio of 25 to 30:1. Layer 5, as deposited, contains particles of free silicon which, as previously indicated, may be uniformly distributed throughout the oxide (or nitride) or distributed in a graded manner so that the greatest concentration is at or near the surface of layer 5. A typical thickness of layer 5 is 200–300 Angstroms.

Once layer 5 is formed, substrate 3 along with other similar substrates is introduced into the deposition apparatus shown in FIG. 2 in order to deposit W by the $H_2$ reduction of tungsten hexafluoride gas ($WF_6$). The deposition apparatus includes a deposition process chamber 20 which encloses a turret-like holder 21 on which substrates 3 are mounted. Tungsten hexafluoride ($WF_6$) gas which is commercially available is introduced into chamber 20 via ports 22. A carrier gas such as helium, argon or nitrogen is also introduced into chamber 20 via ports 22, while hydrogen is introduced into the chamber 20 via input ports 24. Excitation is provided by an infrared sensor lamp assembly 26 which is connected to the turrent-like holder 21. Also connected in a tubing to chamber 20 are a high vacuum valve 28, a throttle valve 30, a blower 32, and a pump 34. These components are used to exhaust chamber 20 through output port 36, in order to remove contaminates and to maintain proper pressure in chamber 20.

The exposed surfaces of the substrates 3 contain tungsten inclusions that serve as nucleation centers for the tungsten that is to be deposited. These inclusions are formed by introducing $WF_6$ into the reactor chamber 20, which has been evacuated to a pressure less than 10 mTorr. The substrates 3 are held at a temperature between about 300°–400° C. $WF_6$ flows over the substrates 3 at a volume flow rate of about 10–20 sccm for a time in the range of 200–300 seconds. Nucleation sites for W are created in the silicon-rich silicon oxide or silicon nitride layer 5 by the following reactions:

2 $WF_6$+3Si (from silicon oxide)→2W ↓ +3 $SiF_4$ ↑
2 $WF_6$+3Si (from silicon nitride)→2W ↓ +3 $SiF_4$ ↑.

In these reactions, W is substituted for free Si particles at or near the surface of oxide or nitride layer 5.

To deposit W, $WF_6$ is introduced into chamber 20 through port 22, while $H_2$ is introduced through port 24. The volume flow rate for these gases is in the range of about 500–2000 sccm, while the substrates 3 are held at a temperature in the range of about 300°–400° C. These conditions are maintained for a time sufficient to deposit W to a desired thickness, using the hydrogen reduction of $WF_6$ in accordance with the following reaction:

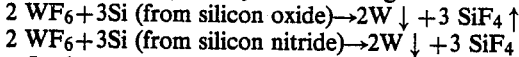

$WF_6$+3$H_2$→W ↓ +6HF ↑.

A strongly adherent structure is made by this technique, since the silicon oxide or silicon-nitride layer 5 bonds strongly to the BPSG layer 4. Because there is insufficient free Si and W in layer 5, this layer will retain its insulating property. Further, since the tungsten bonds to tungsten sites that are tightly bonded into the silicon oxide or silicon nitride matrix, there will be excellent adhesion between the tungsten layer 2 and the silicon oxide or silicon nitride layer 5. The net result is that the entire structure is very resistant to the potentially adverse effects of heating, etc. which can occur during subsequent VLSI processing steps used to provide the final structure.

Another advantage of the present invention is that the Si-rich oxide or nitride layer 5 protects the underlying BPSG layer 4 during the hydrogen reduction of $WF_6$. This reaction produces as a by-product HF gas which is known to etch BPSG (see J. J. Cuomo, "Selective CVD of Tungsten", Third International Conference on CVD, pp. 270–278, 1972). Thus, layer 5 serves a protective function in addition to being a superior bonding layer.

FIG. 3 shows the application of this invention to a graded silicon oxide-silicon nitride via structure, there being a tungsten interconnect between metallization levels. The structure of FIG. 3 includes many of the layers comprising the structure of FIG. 1 and can be made in accordance with the principles described hereinabove. For ease of relating FIG. 3 to FIG. 1, the same reference numerals will be used to denote identical layers or regions.

The structure of FIG. 3 includes a silicon substrate 3 having recessed oxide regions 8 therein. Polycrystalline silicon regions 9 are formed on the oxide regions 8, and are contacted by the tungsten (W) vias 2a and 2b. Tungsten interconnection layer 2 contacts substrate 3 by means of a tungsten via 2a through a via hole formed in the BPSG layer 4, and contacts polycrystalline region 9 by means of a tungsten via 26 through another via hole formed in the BPSG layer 4. The tungsten interconnection layer 2 is strongly bonded to the BPSG layer 4 by means of the bonding layer 5, which is a Si-rich silicon oxide layer having free Si particles 6 at the surface thereof which are replaced by tungsten inclusions during processing, as described previously. The inclusions provide strong bonding sites for the subsequently deposited tungsten, which is deposited by hydrogen reduction of $WF_6$.

In the description of the previous paragraph, the processing steps are described only in a very general way, having been already discussed in detail with respect to FIGS. 1 and 2. The rest of FIG. 3 includes an additional insulating layer 38 of Si-rich silicon nitride located over first tungsten interconnect layer 2, and over portions of the Si-rich oxide layer 5. Nitride layer 38 is Si-rich at its top and bottom surfaces, indicated by the regions 38A on either side of its central region 38B. A second tungsten layer includes tungsten vias 40 and 42, respectively, which contact different portions of the first tungsten interconnect layer 2, through via holes in the nitride layer 38. As with oxide layer 5, the Si particles near the top surface of layer 38 are substituted for by tungsten to provide tungsten inclusions 39 that are strong bonding sites for tungsten vias 40 and 42. The Si-rich bottom portion of nitride layer 38 provides good adhesion to tungsten layer 2. Cu lands 44,46 provide contacts to tungsten vias 40 and 42, respectively, to complete the structure. These lands can be formed by any low resistivity metal (preferably Cu or Al-Cu) with the proper adhesion layer.

The Si-rich surface regions 38A are created by the same type of process used to make the Si-rich region of oxide layer 5. Because the density of free Si in regions 38A is not great, and because central region 38B remains relatively thick, layer 38 retains its insulating property. Via holes in it for vias 40 and 42 are made by standard lithography and etching steps.

The vias 40 and 42 are formed in the same manner as were the vias 2a,2b. Thus, the structure is again located in the reactor of FIG. 2, and tungsten inclusions are introduced in the top surface region 38A by flowing $WF_6$ into the reactor chamber 20, while the chamber pressure, substrate temperature, gas flow rate and time of exposure are maintained at the values mentioned previously.

To deposit the W vias 40 and 42, $WF_6$ and $H_2$ are introduced into the reaction chamber to again deposit W via the hydrogen reduction of $WF_6$. The conditions of temperature, pressure, and flow are the same as those used to deposit W layer 2, and need not be repeated here. After deposition of vias 40,42 contact lands 44,46 of, for example, Cu can be deposited to complete the structure.

While the invention has been described using as an example of the bonding or adhesion layer, a silicon oxide or silicon nitride layer, other bonding layers can be used. For example, the silicon oxide layer can be an SiO or $SiO_2$ layer which is made Si-rich. Other suitable bonding layers include Si-rich layers of silicon oxy-nitrides or the well known passivation layer tetraethyl orthosilicate (TEOS). Other oxysilicates can also be used. Thus, in the practice of this invention, the bonding layer is preferably a silicon-based oxide, nitride, or mixed oxy-nitride layer which is capable of being made Si-rich in a surface region thereof, where the excess silicon particles can be substituted for by the material (e.g., W) to be adhered to the substrate.

In the further practice of this invention, the metal layer to be adhered to the substrate includes not just W, but also other refractory metals such as Nb, Mo, Ti, Ta and Cr and their silicides (such as $WSi_x$, Mo-silicide, etc.) The inclusions introduced into the bonding layer to provide nucleation sites for the depositing refractory metal would then be Nb, Mo, Ti, . . . particles, respectively.

The substrates to which the refractory metals are to be adhered include any materials to which the Si-rich oxide, nitride, or mixed oxy-nitride bonding layers will strongly adhere. The substrate can be used for any purpose, such as a dielectric layer, a semiconducting layer, or even a conducting layer. Examples include single crystal, polycrystalline, or amorphous silicon, insulators including silicon and glasses such as BPSG. Since the substrates contain silicon, the special bonding layers of this invention will strongly adhere to them.

While the invention has been described with respect to particular embodiments thereof, it will be apparent to those of skill in the art, that modifications may be made thereto without departing from the spirit and scope of the present invention. For example, processes other than CVD can be used to deposit the refractory metal and other process steps can be used to substitute for silicon particles in the bonding layer to provide the refractory metal inclusions in the bonding layer.

Having thus described my invention, what I claim as new, and desire to secure by Letter Patent is:

1. A multilayer structure including, in combination, a substrate to which a layer containing a refractory metal is to be bonded, said substrate being one which does not bond strongly to said layer containing a refractory metal,
a layer containing said refractory metal,
an insulating bonding layer selected from the group consisting of silicon oxides, silicon nitrides, and silicon oxy-nitrides located between said layer containing said refractory metal and said bonding layer having free silicon particles therein and inclusions of said refractory metal substituted for at least some of said free silicon within at least the surface region of said bonding layer and forming bonding sites, the amount of said free silicon and said inclusions being sufficiently small that said bonding layer emains insulating, said layer containing said refractory metal being strongly bonded to said sites within said insulating bonding layer.

2. The structure of claim 1, wherein said layer containing said refractory metal is a metal silicide layer.

3. The structure of claim 1, where said substrate is an insulator.

4. The structure of claim 1, where said substrate contains Si.

5. The structure of claim 1, where said substrate is a glass.

6. The structure of claim 1, further including an insulating layer having a via hole therein wherein said layer containing said refractory metal includes a portion thereof extending through said via hole as a via interconnection.

7. The structure of claim 1, where said substrate includes a semiconductor layer in which an active device is formed, and wherein said substrate is further comprised of a layer of insulating material over said semiconductor layer through which a via hole is provided, said layer containing said refractory metal filling said via hole and overlapping said layer of insulating material, said bonding layer being located between said layers of insulating material and said layer containing said refractory metal.

8. The structure of claim 1, where said refractory metal is selected from the group consisting of W, Nb, Mo, Ti, Cr, and Ta.

9. The structure of claim 1, where said bonding layer is selected from the group consisting of Si-rich silicon dioxide and Si-rich silicon nitride.

10. A multilayer structure including, in combination:
a substrate to shich a tungsten-containing layer is to be bonded, said substrate being comprised of a material to which tungsten does not bond strongly,
a tungsten-containing layer overlaying said substrate, and
an insulating bonding layer selected from the group consisting of silicon oxides, silicon nitrides and silicon oxy-nitrides located between said tungsten-containing layer and said substrate, said bonding layer having at least in a tungsten-contacting surface region thereof free silicon particles and tungsten inclusions where said tungsten inclusions are tungsten particles substituted for at least some of said free silicon, said tungsten inclusions being bonding sites for tungsten atoms in said tungsten-containing layer the amount of said free silicon and said inclusions being sufficiently small that said bonding layer remains insulating.

11. The structure of claim 10, in which said substrate includes Si.

12. The structure of claim 11, where said substrate is a glass.

13. The structure of claim 12, where said glass is borophosphosilicate glass.

14. The structure of claim 10, in which said bonding layer is a Si-rich layer selected from the group consisting of silicon oxides and silicon nitrides, and said substrate is a glass.

15. A method for forming a structure wherein a layer containing a refractory metal is to be bonded to a substrate to which said layer does not strongly adhere, comprising the steps of
depositing an insulating bonding layer selected from the group consisting of silicon oxides, silicon nitrides and silicon oxy-nitrides on said substrate, said bonding layer strongly adhering to said substrate and containing free silicon particles therein at least in a surface region of said bonding layer to be contacted by said layer containing said refractory metal,
substituting atoms of said refractory metal for at least some of said free silicon in said bonding layer to produce refractory metal inclusions within the body of said bonding layer, the amount of said free silicon and said inclusions being sufficiently small that said bonding layer remains insulating, said inclusions being bonding sites for deposition of said layer containing said refractory metal, and
depositing said layer containing said refractory metal onto said bonding layer, said bonding sites strongly adhering said deposited layer containing a refractory metal to said insulating bonding layer.

16. The method of claim 15, where said deposited layer containing a refractory metal is refractory metal silicide layer.

17. The method of claim 15, where said refractory metal is selected from the group consisting of W, Nb, Mo, Ti, Cr and Ta.

18. The method of claim 17, where said substrate contains Si.

19. The method of claim 17, where said substrate is a glass.

20. The method of claim 19, where said glass is boroohosphosilicate glass.

21. A method for bonding a tungsten-containing layer to a substrate to which said tungsten-containing layer does not strongly adhere, comprising the steps of
depositing onto said substrate an insulating bonding layer selected from the group consisting of silicon oxides, silicon nitrides and silicon oxy-nitrides which adheres to said substrate, said bonding layer containing free silicon particles therein at least in a region close to the surface of said bonding layer to be contacted by said tungsten-containing layer,
substituting atoms of tungsten for at least some of said free silicon in said bonding layer to produce buried tungsten inclusions in said bonding layer,
the amount of said free silicon and said inclusions being sufficiently small that said bonding layer remains insulating, and
depositing said tungsten-containing layer onto said bonding layer, said tungsten-containing layer adhering to said buried tungsten inclusions to form a strongly bonded tungsten-containing layer-bonding layer-substrate multilayer structure.

22. The method of claim 21, where said substrate contains Si.

23. The method of claim 21, where said substrate is a glass.

24. The method of claim 23, where said glass is borophosphosilicate glass.

25. The method of claim 21, where said substrate is a glass, and said bonding layer is selected from the group consisting of silicon oxides and silicon nitrides.

26. The method of claim 25, where said atoms of tungsten are substituted for said free silicon by contacting said bonding layer with $WF_6$ gas, and said tungsten layer is deposited on said bonding layer by the hydrogen reduction of $WF_6$ gas in the vicinity of said bonding layer.

27. The method of claim 21, where said substrate includes a layer of semiconducting material having an active device therein.

* * * * *